(12) United States Patent  
Freeman

(10) Patent No.: US 6,577,582 B2
(45) Date of Patent: Jun. 10, 2003

(54) DIFFRACTIVE STACK PICKUP HEAD FOR OPTICAL DISK DRIVES AND METHOD TO FABRICATE THE PICKUP HEAD

(75) Inventor: Mark O. Freeman, Hsinchu (TW)

(73) Assignee: Industrial Technology Institute, Hsinchu (TW)

( * ) Notice: Subject to any disclaimer, the term of this patent is extended or adjusted under 35 U.S.C. 154(b) by 0 days.

(21) Appl. No.: 10/021,638

(22) Filed: Oct. 29, 2001

(65) Prior Publication Data

US 2002/0054558 A1 May 9, 2002

Related U.S. Application Data

(62) Division of application No. 09/434,864, filed on Nov. 4, 1999, now Pat. No. 6,351,443.

(51) Int. Cl.[7] ................................................. G11B 7/00
(52) U.S. Cl. ............................ 369/112.07; 369/112.04; 369/112.12
(58) Field of Search ..................... 369/112.07, 112.08, 369/112.09, 112.2, 120, 122, 109, 112–113, 44.12, 121, 44.23, 112.05, 116, 112.21, 112.03, 112.27, 112.25, 112.23, 112.14, 112.26; 372/98, 50, 102

(56) References Cited

U.S. PATENT DOCUMENTS

| | | | | | |
|---|---|---|---|---|---|
| 5,481,386 | A | * | 1/1996 | Shimano et al. | 369/112.07 |
| 5,663,944 | A | * | 9/1997 | Mun | 369/116 |
| 5,771,218 | A | * | 6/1998 | Feldman et al. | 369/112.26 |
| 5,946,281 | A | * | 8/1999 | Ito et al. | 369/112.07 |
| 6,272,097 | B1 | * | 8/2001 | Nakao et al. | 369/112.08 |

* cited by examiner

Primary Examiner—William Korzuch
Assistant Examiner—Kim-Kwok Chu
(74) Attorney, Agent, or Firm—J.C. Patents

(57) ABSTRACT

The invention provides a pickup head used in an optical data storage system. The pickup head contains a diffractive optical element (DOE) stack on a semiconductor substrate. The DOE stack includes multiple diffractive lenses for providing several diffractive surfaces and a middle layer serving as a beamsplitter and servo-generating element for a light reflected from an optical storage medium. The middle layer is sandwiched by the diffractive lenses that are located on both outer parts of the DOE stack. The semiconductor substrate includes at least a laser source and several photodetectors. The middle layer serving its function preferably includes a polarization-selective DOE and a quarter-wave retarder oriented to rotate a polarization state of the laser source, so that only the light reflected from the optical storage medium is diffracted by the polarization-selective DOE.

7 Claims, 11 Drawing Sheets

DIFFRACTIVE STACK PICKUP HEAD FOR OPTICAL DISK DRIVES AND METHOD TO FABRICATE THE PICKUP HEAD

CROSS REFERENCE RELATED TO APPLICATION

This application is a divisional application of, and claims the priority benefit of, U.S. application Ser. No. 09/434,864 filed on Nov. 4, 1999, now U.S. Pat. No. 6,351,443, issued on Feb. 26, 2002.

BACKGROUND OF THE INVENTION

1. Field of Invention

The present invention relates to an optical electronic technology. More particularly, the present invention relates to a diffractive stack pickup head for an optical disk drive and a method to fabricate the diffractive stack pickup head.

2. Description of Related Art

Pickup heads are an opto-electronic means by which a signal is written to or read from an optical disk. FIG. 1 is a system drawing, schematically illustrating a conventional optical disk pickup system. In FIG. 1, the generic optical disk pickup system includes a laser diode light source 20, a beamsplitter 22, and at least one lens 24 for precisely focusing the light from the laser diode 20 onto an information bearing surface of the optical disk 26. The system further includes a multi-element photodetector 28 for receiving light that is reflected from the disk 26, and a servo-generating element 30, such as the cylindrical lens, which is used to alter the reflected beam from the disk 26 into some form whereby the state of focus and tracking can be easily extracted from the signals generated by the light incident on the multi-element photodetector 28. This conventional system can be referred to A. B. Marchant, Optical recording, A Technical Overview, Addison-Wesley Publishing, Menlo Park Calif., 1990, p.197. The general mounting arrangement for these optical elements into a pickup head unit is shown in FIG. 2. In FIG. 2, each component is mounted separately, one at a time, into a pickup head housing 32. The size of the housing 32 is directly related to the image distance of the focusing lens(es) 24, i.e., the distance from the laser diode 20 to the focused image of the laser diode 20 on the disk 26 of FIG. 1. With current technology of refractive molded aspheric lenses, this distance is typically in the range of 25–40 mm, and the size of the housing is roughly of the same order. In some designs, the servo-generating element can be an integral part of the beamsplitter 22 and sometimes is implemented using a diffractive or holographic optical element (DOE). FIG. 3 is a pickup system drawing, schematically illustrating an alternate generic pickup design where the beamsplitter and servo-generating elements are combined into a single DOE and the complete optical system excluding the objective lens is packaged in a small module. In FIG. 3, the design of the pickup system 38 has the advantage that most of the opto-electronic components 40, except the focusing lens/actuator 42, are assembled in a miniature module. The components 40 are also assembled one at a time to form the miniature module. To complete the pickup system, the components 40 are mounted in a pickup housing similar to the one shown in FIG. 2. However, the general size of the pickup system 38 is still determined by the imaging distance of the focusing lens. In other words, the holographic module approach has certain advantages but it does not significantly change the size or weight of the complete pickup system.

SUMMARY OF THE INVENTION

The invention provides an optical disk pickup head with the current state-of-the-art technology having an objective that the invention allows many pickups to be made simultaneously in parallel, thereby significantly reducing manufacturing cost.

The invention also includes another objective that the entire pickup, including the focusing lens, can be made in a very small dimension, such as a few millimeters on a side. This allows multiple pickups to be utilized in a single drive.

As embodied and broadly described herein, the invention provides a pickup head used in an optical data storage system. The pickup head includes a diffractive optical element (DOE) stack on a semiconductor substrate. The DOE stack includes multiple diffractive lenses for providing several diffractive surfaces and a middle layer serving as a beamsplitter and servo-generating element for a light reflected from an optical storage medium. The middle layer is sandwiched by the diffractive lenses that are located on both outer parts of the DOE stack. The semiconductor substrate includes at least a laser source and several photodetectors.

The middle layer's function preferably includes a polarization-selective DOE and a quarter-wave retarder oriented to rotate the polarization state of the laser source, so that only the light reflected from the optical storage medium is diffracted by the polarization-selective DOE.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 4:
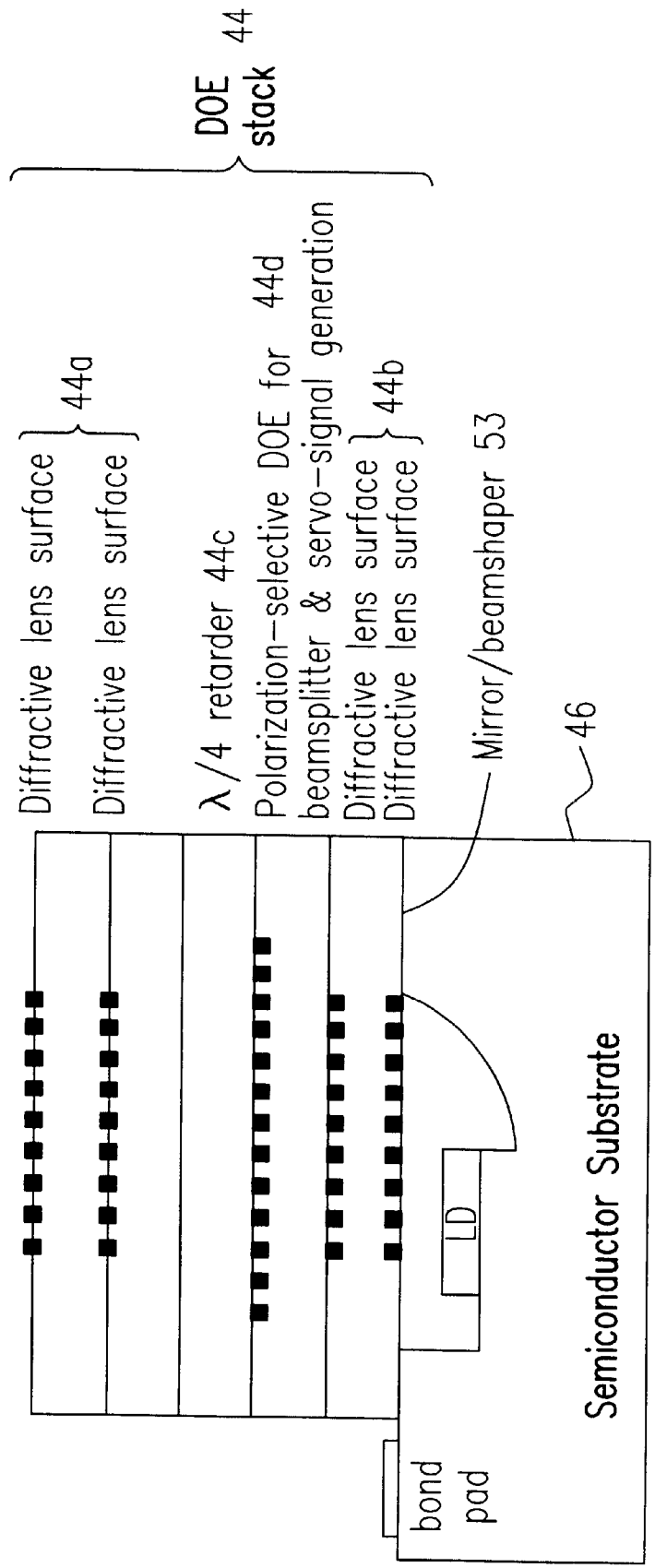
FIG. 4 is a cross-sectional view, schematically illustrating a pickup head including the DOE stack formed on a semiconductor substrate, according to the preferred embodiment of the present invention.

The invention utilizes a stack of diffractive optical elements (DOE) in contact with a semiconductor substrate to build a pickup head. The basic structure is shown in FIG. 4. FIG. 4 is a cross-sectional view, schematically illustrating a pickup head including the DOE stack formed on a semiconductor substrate, according to the preferred embodiment of the present invention. In FIG. 4, a DOE stack 44 is located on a semiconductor substrate 46. The DOE stack 44, for example, includes at least one diffractive lens surface 44a, such as two, on the top of the DOE stack 44, and includes at least one diffractive lens surface 44b on the bottom of the DOE stack 44, where the at least one diffractive lens surface 44b is preferably shown in two. The diffractive lenses 44a, 44b provides several diffractive lens surfaces. The DOE stack 44 also includes a quarter-wavelength retarder 44c and a polarization-selective DOE 44d performing a function of a beamsplitter & servo-signal generation. The quarter-wavelength retarder 44c and a polarization-selective DOE 44d are sandwiched by the diffractive lenses 44a, 44b, and the quarter-wavelength retarder 44c is preferably located on the polarization-selective DOE 44d. The DOE stack 44 can also perform a focusing function. Moreover, the semiconductor substrate 46 usually includes at least a laser diode and several photodetectors, for example, like those shown in FIG. 2.

Figure 5:
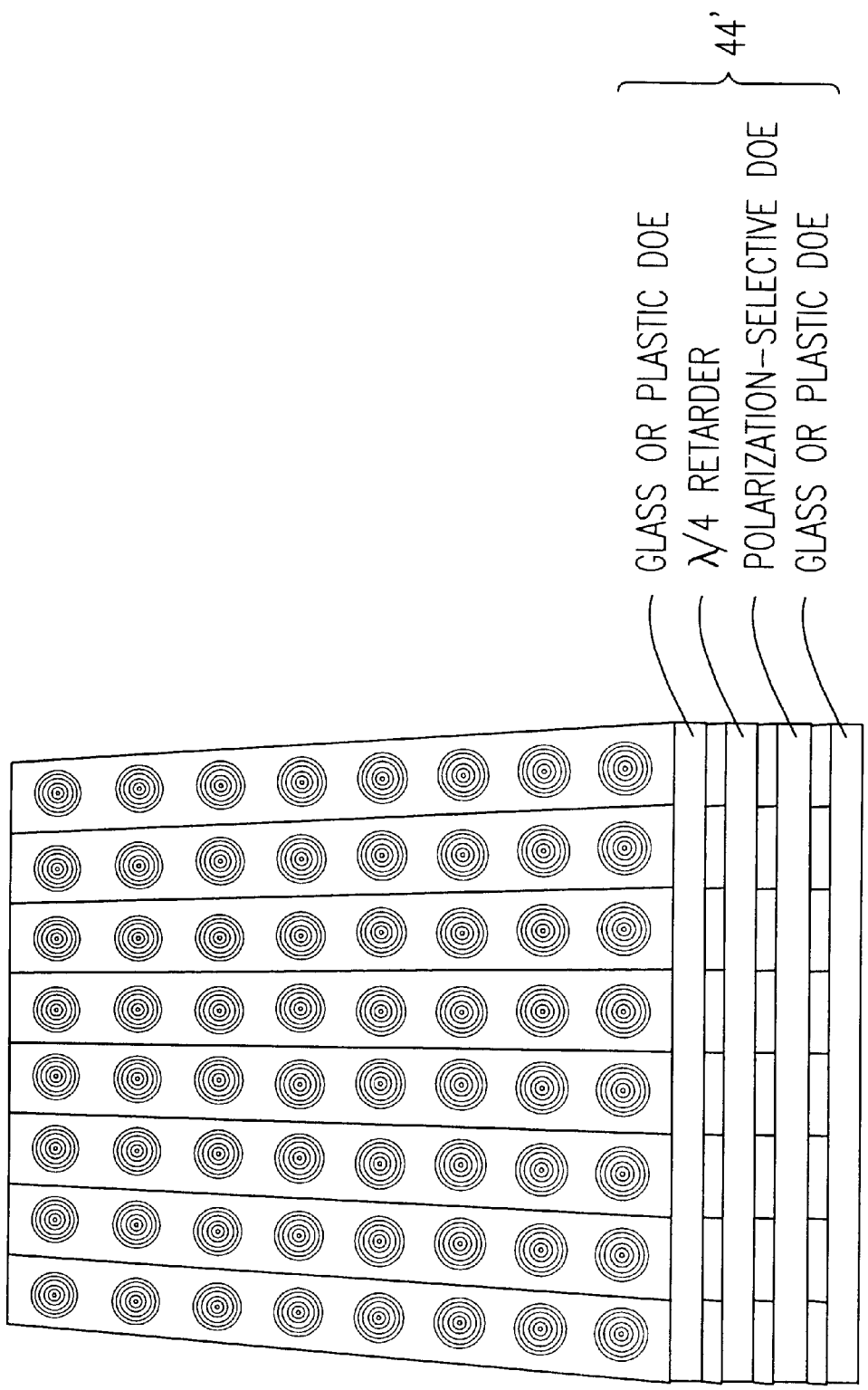
FIG. 5 is a drawing, schematically illustrating a concept of a fabrication method for the DOE stack according to the preferred embodiment of the invention, in which a 2-dimensional array of elements is first fabricated on each wafer layer, and then the wafer layers are aligned and bonded together where the wafers are cut into strips of 1-dimensional arrays of DOE stack elements or into individual DOE stack elements.

During manufacturing, each layer in the DOE stack 44 is treated as wafer-like, and is patterned by standard semiconductor processing technologies, such as processes of photolithography and etching. The pattern of each layer includes, for example, a regular array of a particular shape that is required for each individual layer according to the pattern design. In other words, many identical copies of the diffractive surface pattern required by the design for a given layer of the DOE stack are fabricated simultaneously on the wafer. FIG. 5 is a drawing, schematically illustrating a concept of a fabrication method for the DOE stack according to the preferred embodiment of the invention, in which a 2-dimensional array of elements is first fabricated on each wafer layer, and then the wafer layers are aligned and bonded together where the wafers are cut into strips of 1-dimensional arrays of DOE stack elements or into individual DOE stack elements. In FIG. 5, as each layer of the DOE stack 44 is formed with the desired pattern, each layer is stacked up to form a preliminary DOE stack 44' with a two-dimensional pattern. The preliminary DOE stack 44' is then, for example, cut into several strips. Each strip is a set of the DOE stack 44 of FIG. 4. The layers on the outsides of the DOE stack 44 are the diffractive lens surfaces 44a, 44b of FIG. 4 and are composed of, for example, glass, plastic, or other similar material.

The diffractive lens surfaces 44a, 44b can diffract light for any and all polarization states. The focusing power, which images the laser diode onto the disk information surface with a high numerical aperture (NA) convergence of the light on the disk side, is distributed between three or four diffractive lens surfaces 44a, 44b of the DOE stack. In theory, the focusing power could be totally realized with only one or two DOE's. The requirement of high-NA, such as NA=0.6 for a DVD pickup head, leads to a fine pitch for the grooves of the DOE, which makes them difficult or impossible to manufacture and adversely affects the diffraction efficiency of the DOE stack 44. By distributing the focusing power between three or four surfaces uniformly, high diffraction efficiency can be achieved and the minimum groove spacing is increased making fabrication feasible. Furthermore, it is well known that DOE's are highly dispersive. By using multiple diffractive surfaces that together form the focusing lens, one can design these surfaces with a balance of positive and negative powers to achieve the desired amount of achromaticity. This cannot be achieved by only using a single diffractive surface.

The sandwiched layers 44c and 44d of the DOE stack 44 of FIG. 4 also include another DOE surface. This surface implements the functions of beamsplitter and servo-generating element. The DOE pattern and the multi-element photodetector pattern, as mentioned in FIG. 5, are designed such that one can determine the information recorded on the disk as well as the state of focus and tracking of the light spot on the disk from the electrical signals. The electric signals are generated by the light incident on the photodectors. The servo-generating and beamsplitting function can be implemented using either one or two layers. When implemented with just one layer, this single layer replaces the two layers 44c and 44d shown in FIG. 4. This single layer is made from an isotropic material and diffracts light of any polarization state. The forward-going light (i.e. towards the disk) that is diffracted by this layer is not used. The return-path light, which is returning due to reflection from the disk, is diffracted onto the photodetectors. Alternatively, the servo-generating/beamsplitter functions may be implemented using two layers 44c and 44d as shown in FIG. 4. These two layers are either made from birefringent materials or by other means fabricated such that their influence on an optical beam passing through them depends on the polarization of the incident beam. The layer nearest the laser diode, 44d, has a polarization-selective DOE fabricated on one surface. The laser emits linearly polarized light. As it propagates from the laser towards the disk, the polarization-selective DOE is designed, and its birefringence axis is oriented, such that no diffraction occurs. The other polarization-dependent layer, 44c, i.e., the one nearer the disk, is fabricated as a quarter-wave retarder and is oriented such that its axis is at 45 degrees to the direction of polarization emitted by the laser. Passing through this quarter-wave retarder layer 44c twice, once as it propagates from the laser to the disk and a second time as the light reflected from the disk passes back through the pickup head, the polarization direction of the light is rotated by 90 degrees. As a result, when the light reflected from the disk reaches the polarization-selective DOE surface 44d, it is now of the correct polarization orientation to be diffracted with high efficiency by this surface onto the photodetectors.

Figure 6:
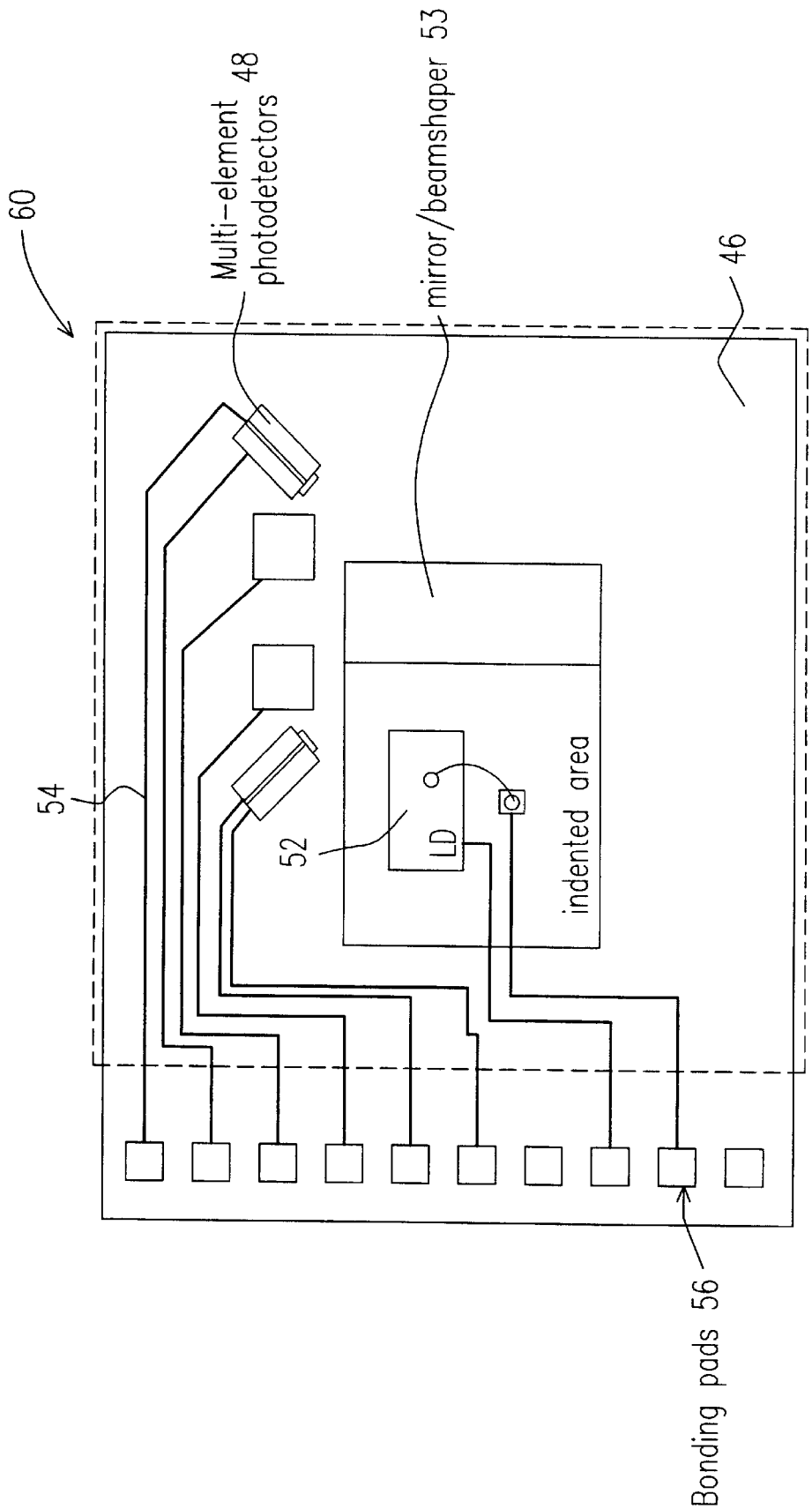
FIG. 6 is a top view, schematically illustrating the structure of the pickup head on a the semiconductor substrate, according to the preferred embodiment of the invention.

The laser diode and the multi-element photodetectors are fabricated or mounted on the semiconductor substrate 46. The basic layout of the components on the substrate 46 is shown in FIG. 4 and further shown in FIG. 6. FIG. 6 is a top view, schematically illustrating the structure of the pickup head on the semiconductor substrate, according to the preferred embodiment of the invention. The structure shown in FIG. 6 is one unit of a laser/photodetector system element 60. In FIG. 6, the semiconductor substrate 46 includes an indentation or well 50 where the laser diode 52 is located. The laser diode 52 has a reflecting surface (mirror), also called mirror/beamshaper 53, in front of the laser emission facet to turn the laser beam by 90 degrees so that the laser beam exits perpendicular to the plane of the semiconductor substrate 46. This reflecting surface may also have curvature or diffractive power so as to perform beamshaping on the laser beam. In the production process, a semiconductor wafer 46 is patterned with an array of the laser and multi-element photodetector systems 60 as described above. Each step of the fabrication process is performed on all array elements in parallel, such as a typical semiconductor fabrication. In other words, several pickup elements are fabricated on each semiconductor wafer at the same time. Metal traces 54 are also formed to allow several bonding pads 56 formed on the substrate 46 to be electrically coupled to the photodetectors 48. It must be noted that the bonding pads 56 should not be covered when the DOE stack 44 is mounted on the semiconductor substrate 46.

Figure 7:
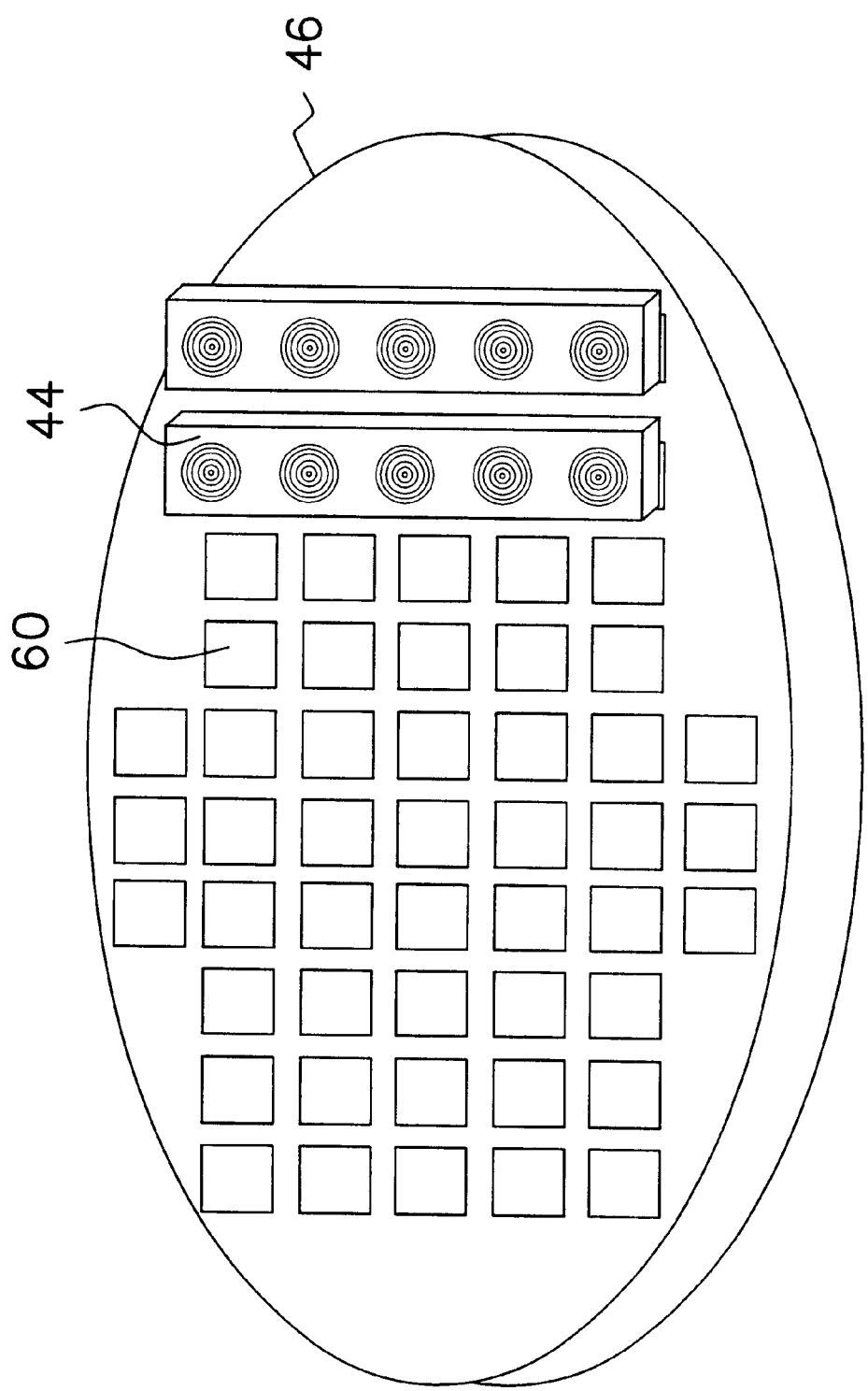
FIG. 7 is a drawing, schematically illustrating a method for mounting the strips of 1-dimensional arrays of DOE stack elements onto the array of laser diode/multi-element photodetector systems that has been fabricated on the semiconductor substrate wafer, according to the preferred embodiment of the invention.

As the DOE stack 44 is to be assembled on the semiconductor substrate 46, the optical components of the DOE stack 44 must be properly aligned and bonded to the optoelectronic laser diode and the photodetector system on the semiconductor substrate 46. There are various ways to assemble the DOE stack 44. The semiconductor substrate 46 and the DOE stack can be each diced into individual pickup elements and bonded one by one. Or the DOE stack 44 can be diced into individual elements, and then each is mounted on the semiconductor substrate 44 at the desired place. FIG. 7 is a drawing, schematically illustrating a method for mounting the strips of 1-dimensional arrays of DOE stack elements onto the array of laser diode/multi-element photodetector systems that has been fabricated on the semiconductor substrate wafer, according to the preferred embodiment of the invention. In FIG. 7, several pickup elements are fabricated in parallel. The DOE stack 44 is a strip cut from the preliminary DOE stack 44' of FIG. 5. Each DOE stack 44 includes an one-dimensional array of DOE stack elements, which have the same spacing as the laser/photodetector system elements 60 on the semi-conductor substrate 46. The one-dimensional array strips of DOE stack 44 can be aligned row by row with respect to rows of the laser/photodetector system elements 60, each of which has an opening to expose the bonding pads for leading electric signals between the DOE stack array strips 44. After the mounting the DOE stack 44 on the semiconductor substrate 46, the substrate 46 is diced into individual pickups.

The pickup fabricated by the above method of the invention can have various applications in the optical pickup head. Several embodiments for the pickup system using the DOE stack are, for example, shown in the following.

Embodiment 1

Figure 8:
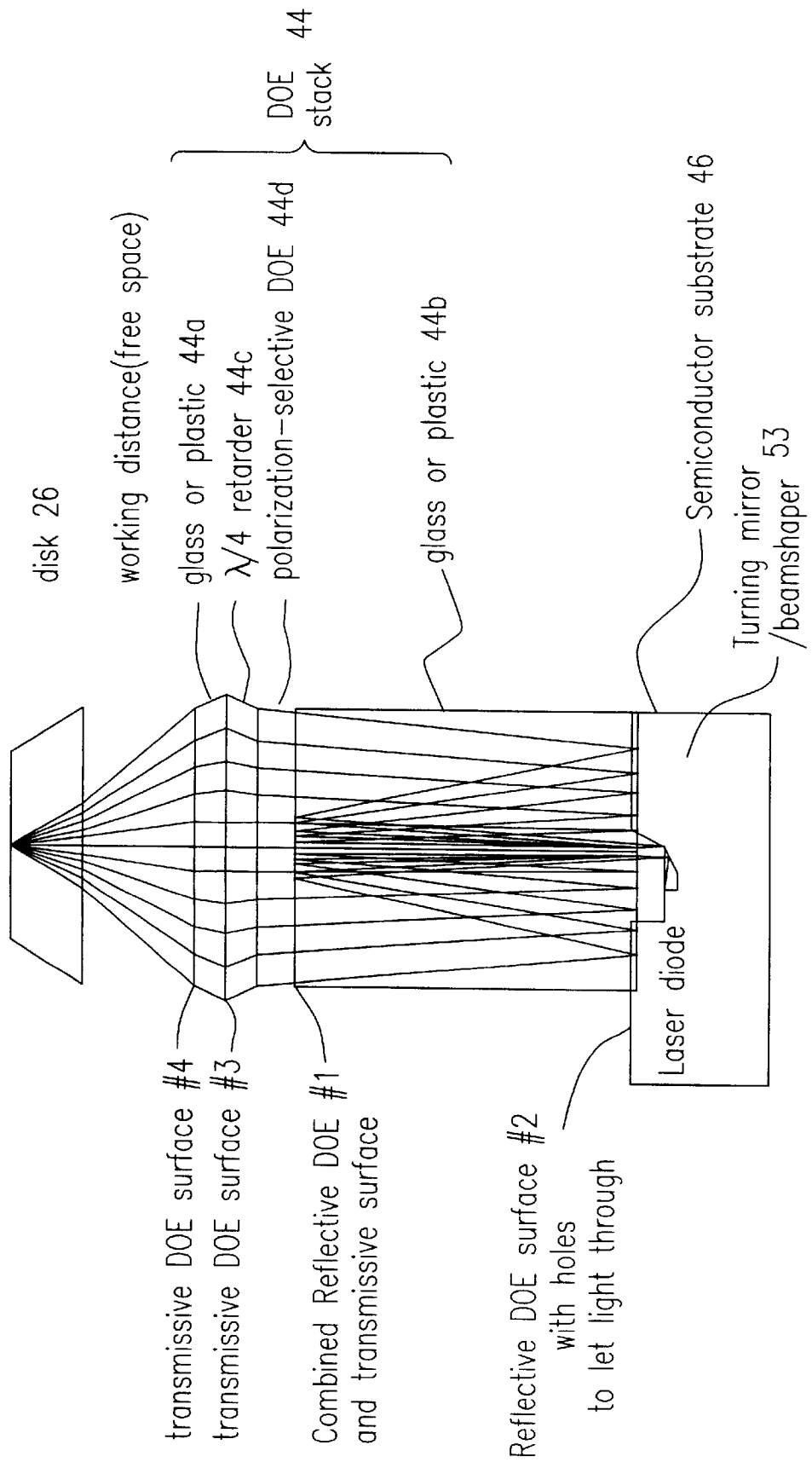
FIG. 8 is a drawing, schematically illustrating a pickup system using the DOE stack according to a first preferred embodiment of the invention, in which light path through the DOE stack is folded by several reflective DOE surfaces and the DOE stack contains both reflective and transmissive DOE surfaces.

FIG. 8 is a drawing, schematically illustrating a pickup system using a DOE stack according to a first preferred embodiment of the invention, in which light path through the DOE stack is folded by several reflective DOE surfaces and the DOE stack contains both reflective and transmissive DOE surfaces. In FIG. 8, a distinctive part of this embodiment is that reflective DOE surfaces 1 and 2 are used as two of the DOE lens surfaces. The need for a high NA on the disk side of the lens and a working distance on the order of a millimeter essentially determines the beam size at the lens. The comparatively low NA of the beam emitted by the laser diode 52 requires a certain distance to expand to this size, longer than the lens to the disk image distance by a factor of the ratio of lens NA to the beam NA. In this embodiment 1, a technique similar to a reflecting telescope, which folds the optical distance into a small space, is used. Light enters the diffractive stack through at least a transparent opening at the reflective DOE surface 2. It is incident on reflective DOE surface 1 that is designed to reflect the beam and to expand its divergence. In this design, we use a diffractive surface to diverge the beam, which allows the surface to remain flat and, therefore, stackable. The beam is diverged at DOE surface 1, thereby increasing the beam NA so that it takes less optical path length to reach the desired beam cross-sectional diameter. This also, in turn, allows the pickup to be fabricated in a smaller dimension. The DOE surface 2 again reflects the beam back in the direction of the disk 26. Depending on the particular design, it may have converging, diverging, or have no focusing power. This degree of freedom in the design can also be used to achromatize the diffractive stack lens. In summary, by folding the beam with reflection surfaces, light passes through the first layer of the diffractive stack, for example, three times. This results in that the needed optical path length is folded into a smaller physical space. By increasing the beam NA at DOE surface 1 and perhaps surface 2, the required optical path length is also reduced.

As the light beam again passes by DOE surface 1, the reflective DOE blocks a portion of the light beam, but most portion of the light beam passes through the transparent region outside of the DOE reflective region. The beam polarization and the orientation of the polarization-selective DOE 44d are designed so that the forward-going light, which propagates from the laser diode 52 to the disk 26, is not diffracted but rather passes directly through the polarization-selective DOE 44d. After transiting the quarter-wave retarder 44c, the linearly polarized light becomes a circularly polarized light. The diffractive DOE surface 3 and 4 both focus the light so that the desired high-NA converging beam is incident on the disk 26. The diffractive powers of the DOE surfaces 1–4 are designed together so as to minimize the physical size of the pickup and to share the required total focusing power. In this manner, the pickup can achieve a high diffraction efficiency, a reasonable minimum groove spacing on the individual DOE surfaces, and the necessary degree of achromaticity.

After reflection from the disk 26, the light beam again travels through the DOE surfaces 4 and 3, and the quarter-wave retarder 44c. The net result of traversing the properly-oriented quarter-wave retarder 44c two times, is that the light emerges linearly polarized with polarization direction rotated by 90 degrees relative to the light emitted by laser diode 52. This is the polarization direction for which diffraction by the polarization-selective DOE is maximized. The polarization-selective DOE 44d, serving the role of a beamsplitter, diffracts the light beam towards the multi-element photodetectors 48 (see FIG. 6) on the semiconductor substrate 46, accessible through transparent openings at the DOE surface 2. The polarization-selective DOE 44d also play the role of a servo-generating element, which is used in conjunction with the multi-element photodetectors 48 to produce an electronic signal that is used to determine whether or not the light is properly focused on the disk 26 at its surface. The signal is also called the focus error signal (FES). A tracking error signal (TES) is also produced to determine whether or not the focused spot is properly following the track of information on the disk 26. In general, the polarization-selective DOE 44d and the photodetectors 48 can be designed to implement any of a number of well-known servo-generating methods, including but not limited to the astigmatic method, the knife-edge method, or the spot-size detection method for generating FES signals. Moreover, the TES signals can be generated by, for example, a pushpull (PP) and differential phase detection (DPD) method. The radio-frequency (RF) signal containing the information stored on the disk 26 is the sum of the electrical signals from all of the multi-element photodetectors 48.

Figure 9:
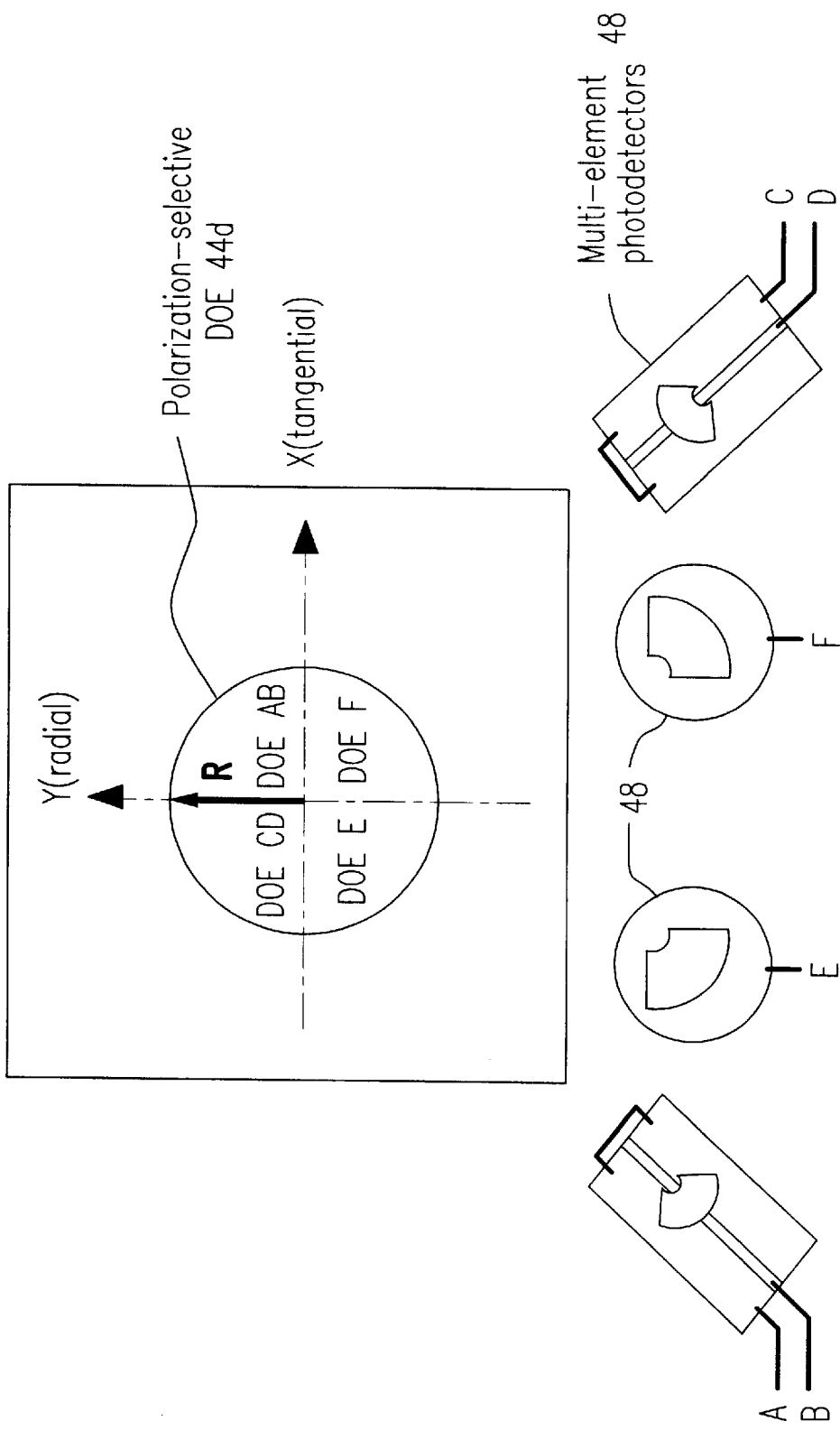
FIG. 9 is a drawing, schematically illustrating a structure for the beamsplitter/servo-generating DOE and the multi-element photodetectors, according to the first preferred embodiment of the invention.
Figure 10:
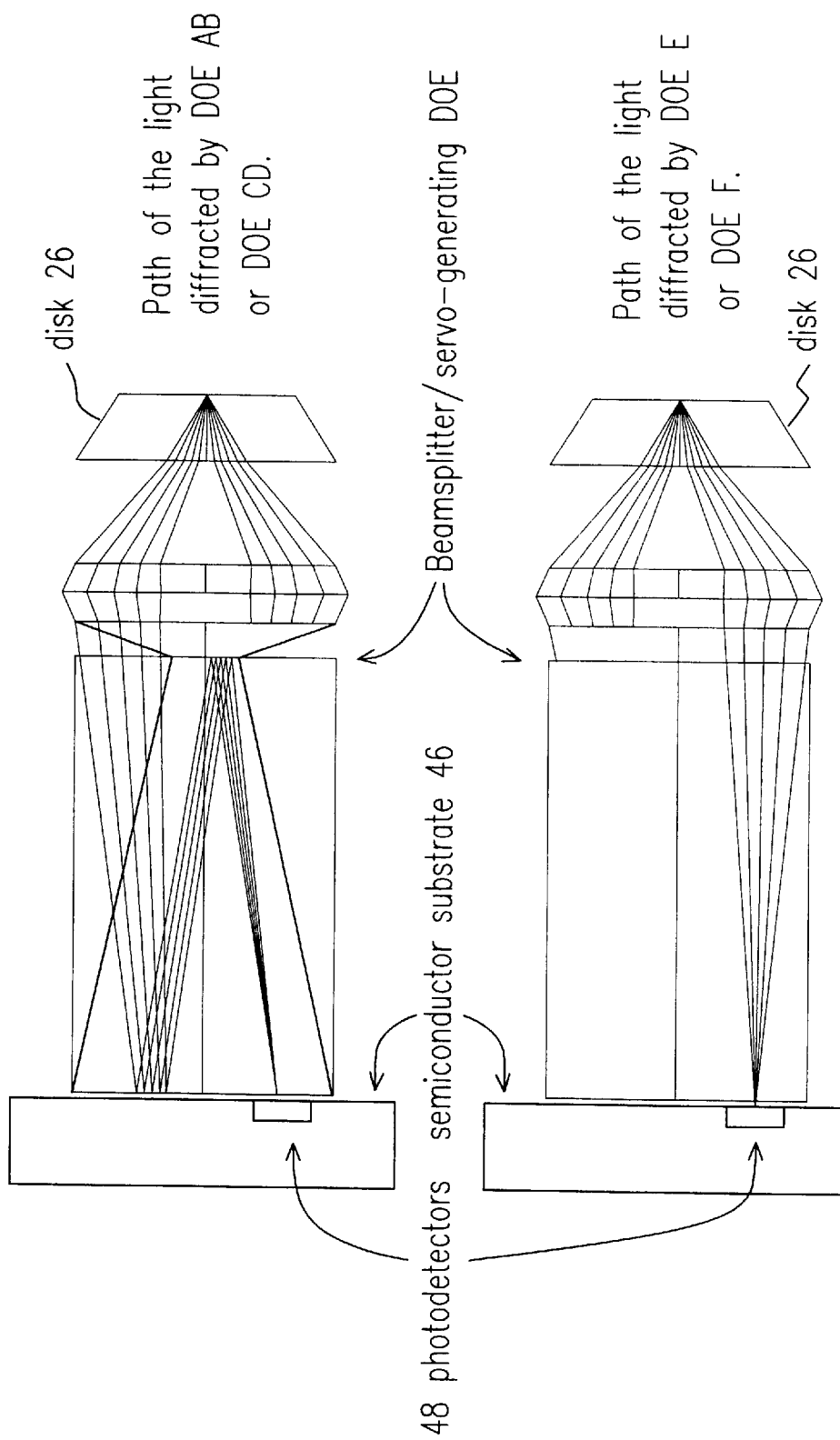
FIG. 10 is a drawing, schematically illustrating the DOE for the beamsplitter and the servo-signal generating element, according to the first preferred embodiment of the invention.

A preferred method to form a compatible servo-generating element is described in the following. FIG. 9 is a drawing, schematically illustrating a structure between the beamsplitter/servo-generating DOE and the multi-element photodetectors, according to the first preferred embodiment of the invention. In FIG. 9, the optical beam can be substantially centered on this polarization-selective DOE 44d. It is divided into four regions, each of which directs part of the light beam from the disk onto a different photodetector element 48. FIG. 10 is a drawing, schematically illustrating the DOE for the beamsplitter and the servo-signal generating element, according to the first preferred embodiment of the invention. The light may either go directly from the polarization-selective DOE 44d to the photodetectors 48 as shown in the lower drawing, or it may be reflected by the reflective DOE surfaces before it reaches the photodetectors as shown in the upper drawing.

Both FIG. 9 and FIG. 10 schematically illustrate one preferred design for the beamsplitter/servo-generating DOE 44d and the multi-element photodetectors 48 that is compatible with the stack pickup designs of the invention. The X-axis corresponds to the tangential disk direction and the Y-axis to the radial disk direction. In FIG. 9, the parts of the light beam reflected from the disk, falling on the DOE AB and the DOE CD, are diffracted onto the multi-element photodetectors AB and CD respectively. The DOE AB and the DOE CD in conjunction with the multi-element photodetectors AB and CD implement a method of focus error detection. The focus error signal is given by:

$$FES=(SA-SB)-(SC-SD),$$

where SA, SB, SC, and SD indicate the electrical signals generated by light falling on the photodetectors A, B, C, and D respectively. The axis of the central strips of the multi-element photodetectors 48 AB and CD, such as the strips B and D, are at +/−45 degrees relative to the Y-axis. In this manner, the optical spots diffracted by DOE AB and DOE CD remain centered on the central strips of detectors AB and CD independent of slight wavelength shifts of the laser light that invariably occur with aging or temperature change. As a result, the proper FES is maintained despite shifts in wavelength. The parts of the beam reflected from the disk that fall on DOE E and DOE F are diffracted onto photodetector elements E and F respectively. They are used to provide DPD and pushpull (PP) tracking error signals as given by the following expressions:

$$TES_{DPD}=\text{phase}(SA+SB+SE)-\text{phase}(SC+SD+SF),$$

$$TES_{PP}=(SA+SB+SC+SD)-(SE+SF),$$

where SE and SF indicate the electrical signals generated by light falling on photodetectors E and F respectively. The RF signal containing the information stored on the disk is the sum of the electrical signals from all of the multi-element photodetectors 48. In this embodiment 1, the photodetectors are on the opposite side of the optical axis, (that is, the axis running from the laser diode to the focused spot on the disk), from the quadrant elements of DOE AB and DOE CD. The method of the invention makes use of the reflective and diffractive functions of DOE surfaces 1 and 2 in the optical path of the light diffracted by DOE AB and DOE CD of the polarization-selective DOE 44d to bring the light across the optical axis and onto the photodetectors AB and CD. This is schematically shown in FIG. 10. In FIG. 10, the upper drawing shows the path of the light diffracted by DOE AB or DOE CD and the lower drawing shows the path of the light diffracted by DOE E or DOE F.

Embodiment 2

Figure 11:
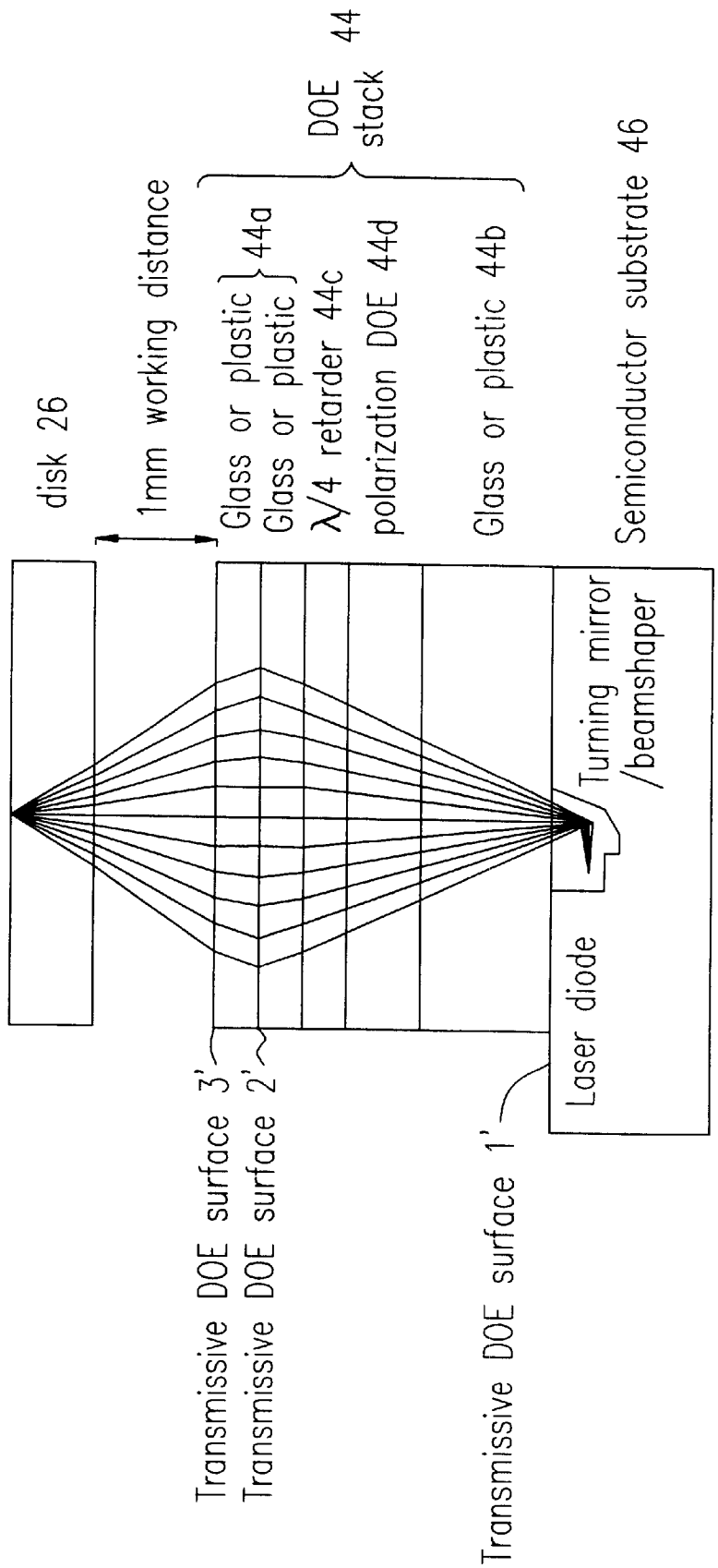
FIG. 11 is a drawing, schematically illustrating a DOE stack, according to a second preferred embodiment of the invention.

FIG. 11 is a drawing, schematically illustrating a DOE stack, according to a second preferred embodiment of the invention. In FIG. 11, light travels through the DOE stack 44 in one direction from the laser diode to the disk, and in the reverse direction from the disk to the photodetectors. The embodiment 2 of FIG. 11 is basically similar to the embodiment 1 of FIG. 8, but the DOE stack 44 contains only transmissive surfaces and no reflective surfaces. All DOE surfaces 1', 2', and 3' are now transmissive. Taking the optical axis from the laser to the focused spot on the disk to be the Z-direction, the light travels completely in the positive Z (+Z) direction from the laser to the disk and completely in the negative Z (−Z) direction from the disk to the multi-element photodetectors. In this manner, three or more transmissive DOE surfaces are used, in which three DOE surfaces are shown in FIG. 11. The transmissive DOE surfaces are used to focus the light beam from the laser diode onto the disk with high NA. The DOE surface 1' expands the divergence of the light beam from the laser diode so that the light beam can achieve its desired size in a shorter optical path length. The DOE surface 2' and 3' share the work of focusing the light beam so that the desired high-NA converging beam is incident on the disk 26. The diffractive power of the DOE surfaces 1', 2', and 3' are designed together to minimize the physical size of the pickup and to share the required focusing power such that a high diffraction efficiency, reasonable minimum grooving spacing, and the necessary degree of achromaticity can be achieved.

As in embodiment 1, the polarization-selective DOE 44d is oriented such that it does not diffract the linearly polarized light travelling from the laser diode to the disk 26. The quarter-wave retarder 44c is oriented such that when the light beam passes through the quarter-wave retarder 44c twice, once on the way towards the disk 26 and once on the return trip after reflection from the disk, the linear polarization direction of the laser light is rotated by 90 degrees. This is the polarization state for which diffraction by the polarization-selective DOE 44d is maximized. The polarization-selective DOE 44d, as in embodiment 1, serves the role of a beamsplitter, diffracting the light beam onto the multi-element photodetectors, and also the role of servo-generating elements, altering the amplitude and phase of the diffracted light field in such as way that appropriate FES and TES signals can be extracted from the electrical signal generated by the multi-element photodetectors. Alternatively, as in the previous embodiment, the polarization-selective DOE 44d and the quarter-wave retarder 44c can both be replaced by a single non-polarization-selective DOE that implements the servo-generating and beamsplitting functions, albeit with less efficiency than the two-layer method. Any of the standard servo-generating approaches can be used including, but not limited to, the particular method described above (FIG. 9) or the astigmatic, knife-edge, or spot-size detection methods for generating FES, and the pushpull or DPD method for generating the TES can be used in this design. The RF signal containing the information stored on the disk is the sum of the electrical signals from all of the multi-element photodetectors.

Embodiment 3.

Embodiment 3 is similar to embodiment 1 except the edge-emitting laser diode 52 and the turning mirror/beamshaper on the semiconductor substrate are replaced by a vertical cavity surface emitting laser (VCSEL) source. The VCSEL is a type of semiconductor laser that emits light from the top flat laser chip surface rather than from its edge. Since it emits light form its top surface, the VSCEL can be mounted flat within the well in the semiconductor substrate and the light naturally propagates towards the diffractive stack. No turning mirror is required. Furthermore, the light beam emitted by the VCSEL has a circular cross-section and no astigmatism. Therefore, the beamshaper is also not necessary.

Embodiment 4

The invention also provides the embodiment 4, which is similar to embodiment 2 but the edge-emitting laser diode and the turning mirror/beamshaper on the semiconductor substrate are replaced by a VCSEL source.

Figure 1:
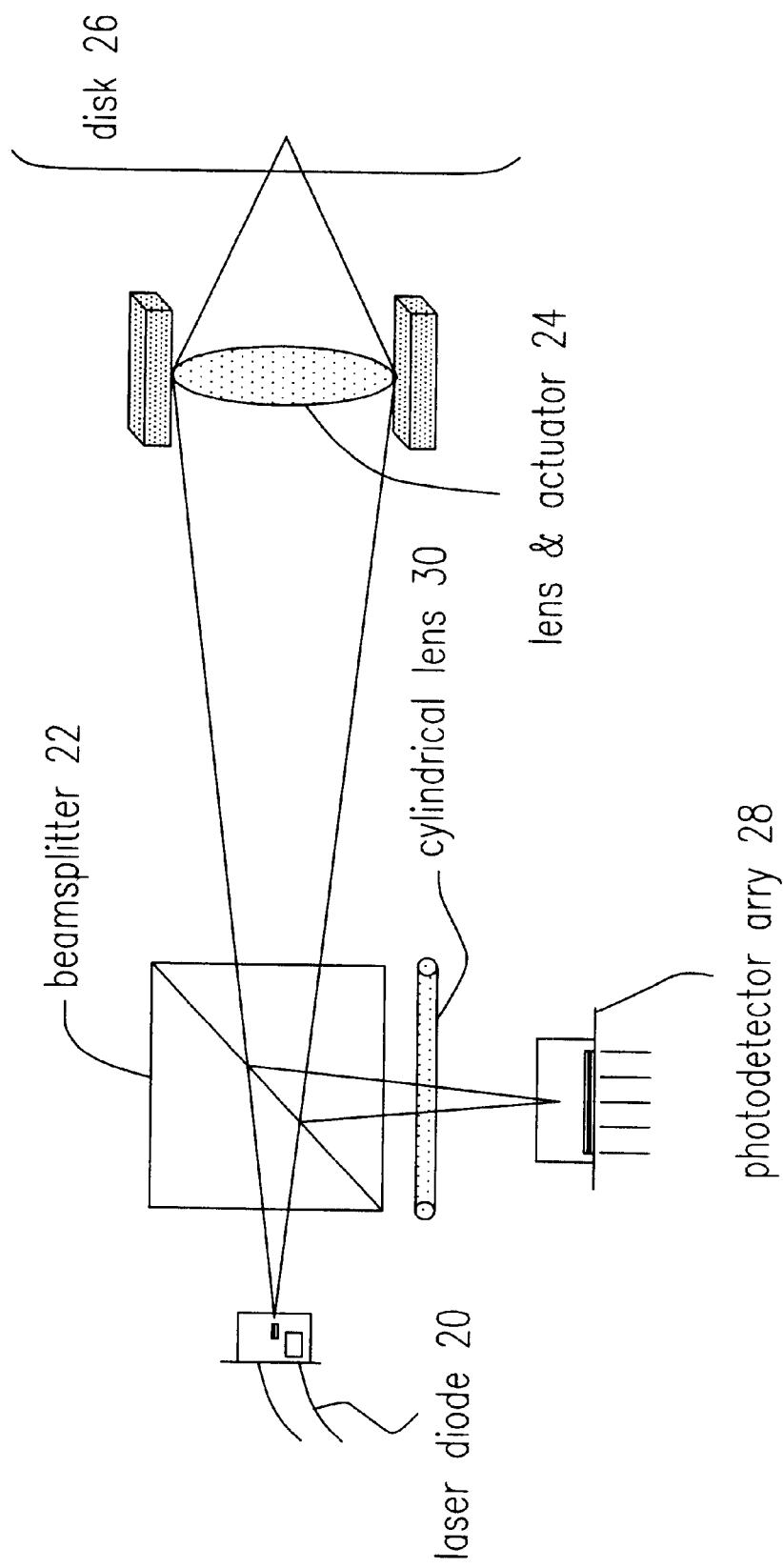
FIG. 1 is a system drawing, schematically illustrating a conventional optical disk pickup system.
Figure 2:
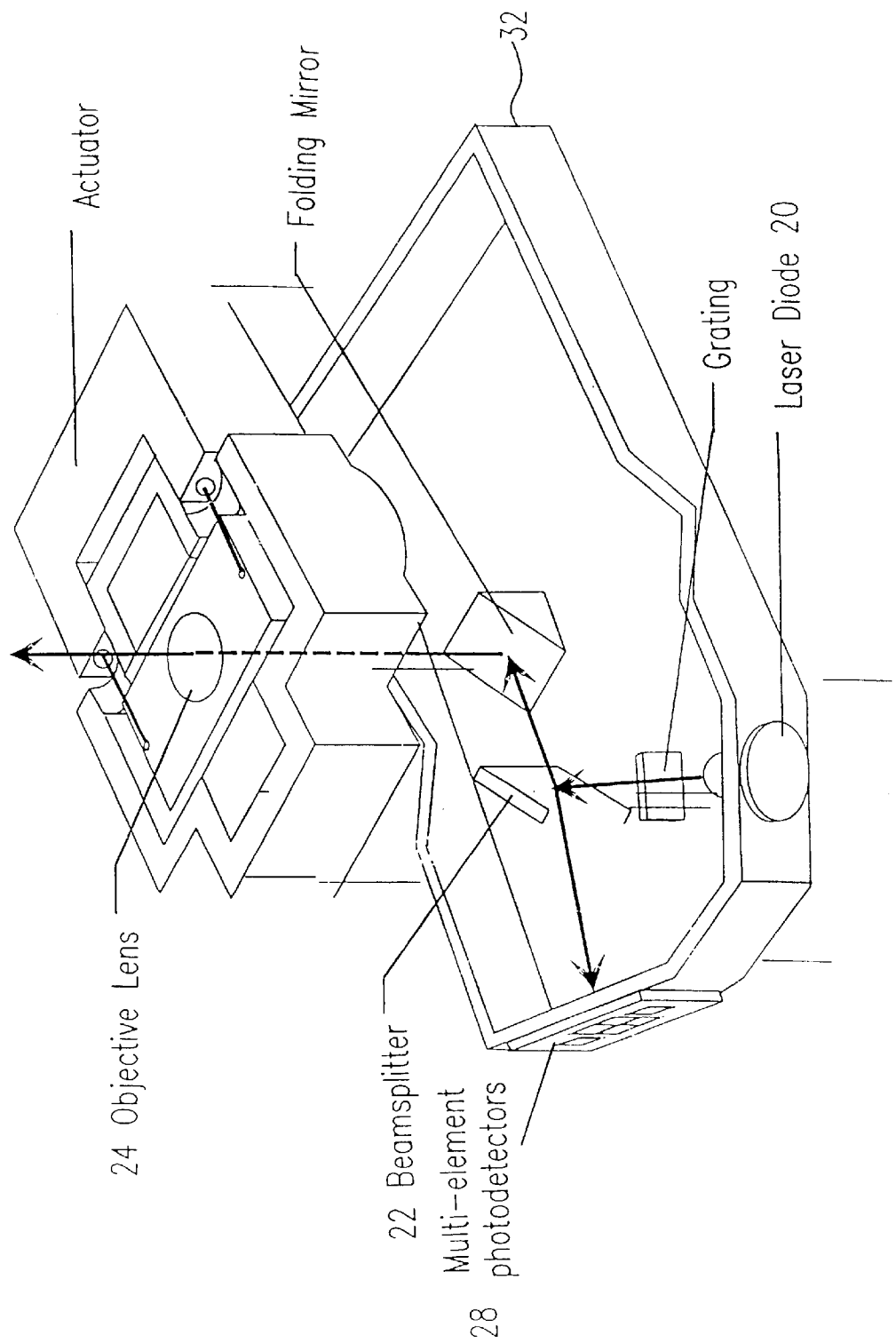
FIG. 2 is a dissected perspective view, schematically illustrating a conventional mounting structure of optoelectronic components into a pickup head unit.
Figure 3:
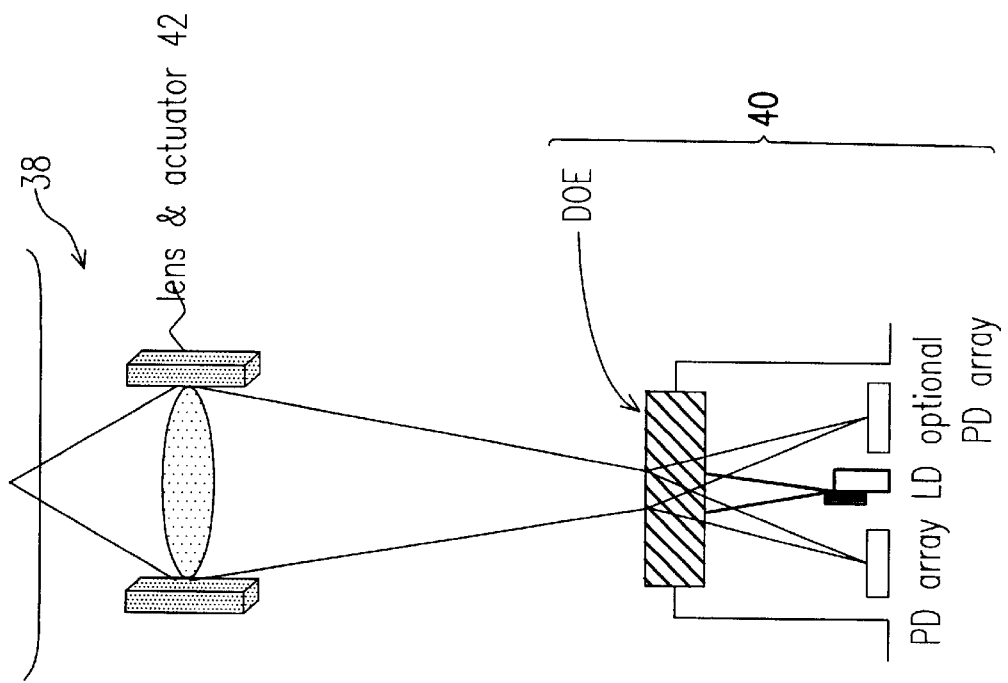
FIG. 3 is a pickup system drawing, schematically illustrating an alternate generic pickup design where the beamsplitter and servo-generating elements are combined into a single DOE and the complete optical system excluding the objective lens is packaged in a small module.

The invention provides four embodiments above with several advantages. A traditional style discrete component optical pickup head for disk drives is shown in FIG. 1 and FIG. 2. Every component, laser, lens, beamsplitter, mirror, etc., are discrete and separately mounted in a large housing. Another pickup design sometimes known as a holographic hybrid pickup is shown as prior art in FIG. 3. This conventional design uses a diffractive or holographic element to serve the dual functions of beamsplitter and servo-generating element. However, it still requires the separate assembly of many of the components within the holographic module and must be mounted in a pickup housing with a separate objective lens giving an overall size and weight comparable to a traditional discrete component pickup design. The present invention gives a complete pickup with the same functionality as the traditional discrete component design or holographic hybrid design, but with a small fraction of the size and weight. Due to this advantage, the present pickup enables the design of disk drives of smaller physical size or the use of multiple pickups within a single drive, for example, to read multiple disk surfaces. Moreover, unlike the traditional or holographic hybrid pickups, which require separate assembly of each pickup, the present invention is conducive to mass production of many pickups in parallel. The primary optical and optoelectronic elements are all produced using lithography and standard batch processing procedures, so that many pickups are made at once rather than one at a time. This will significantly reduce the cost of producing each pickup.

A prior art pickup design using two mirrored flat surfaces and a single DOE surface has been disclosed in the U.S. Pat. No. 5,621,716. In U.S. Pat. No. 5,621,716, the optical path length is reduced by folding it using reflective surfaces. Another prior-art pickup design using two transmissive DOE surfaces has been disclosed in the U.S. Pat. No. 5,805,556. The first DOE surface, nearest to the laser, serves the dual functions of expanding the divergence of the laser beam so as to shorten the optical path length and providing beamsplitter/servo-generating functions for the return beam after reflection from the disk. The second DOE surface focuses the expanding beam at high NA onto the disk. However, these two prior-art pickup designs above still are not efficient designs. The present invention provides new pickup designs with many important advantages over the prior-art designs.

In conclusion, the present invention includes several advantages as follows:

1. The invention has at least an advantage of diffractive reflective surfaces over planar reflective surfaces. Embodiment 1 of the invention uses diffractive reflective surfaces to expand the beam divergence while folding the optical path. In this way, the optical path length and the size of the pickup can be made appreciably smaller than the prior-art design because the prior art provides no means for expanding the beam divergence.

2. The invention has at least an advantage of sharing the multiple optical functions between multiple diffractive surfaces. The prior art has only a single diffractive surface to provide all of the optical functions. The optical functions include focusing the light beam at high NA onto the disk, and serving as the beamsplitter/servo-generating element, transforming the beam returning from the disk such that its intensity pattern on the signal photodetectors allows the FES, TES and RF information signal to be extracted. There are many advantages to the approach used in the present design where a stack of multiple diffractive surface shares the multiple optical functions.

3. The invention has at least an advantage of maintaining a comparatively large minimum groove spacing. For a reasonable lens NA, such as NA=0.6 used in digital versatile disk (DVD) system, the minimum groove spacing required for focusing the light with a single diffractive surface is less than a micron. The diffraction efficiency is unavoidably and dramatically reduced when the groove spacing for a lens becomes so close to the wavelength of light. Thus the effective profile of the beam that is being focused is distorted due to high efficiency at the center of the lens where the groove spacing is large and low efficiency at the periphery of the lens where the groove spacing is small. Ultimately, this produces a poorly focused spot on the disk. With a stack of diffractive surfaces, the minimum groove spacing for each surface can be kept large enough to avoid the distortion due to non-uniform diffraction efficiency.

4. The invention has at least an advantage of using a separate DOE surface for the beamsplitter/servo-generating function. There is also a significant advantage in using a separate DOE surface different from the diffractive lens surfaces, as in the present invention, to implement the beamsplitter and servo-generating element functions. Combining all of the optical functions into the same diffractive surface as in the prior art both necessitates sharing the diffraction efficiency between the lens and beamsplitter/servo-generating functions and unavoidably creates spurious diffraction orders arising from crosstalk between the two dissimilar optical functions. Even with ideal performance, the best efficiency that can be achieved would be less than 25%. (This is estimated by assuming 50% of the light into the lens focusing function, 50% of the light into the beamsplitter/servo-generating function. Also and, only half the light goes into the focused spot on the disk and only half of that is steered by the beamsplitter onto the photodetectors.) In fact, the power into the spurious diffraction orders due to crosstalk will also be significant so that the efficiency will be even less than the ideal values. Furthermore, the spurious diffraction orders give rise to significant stray light in the system that may degrade the pickup performance. All of these problems are avoided by using a separate polarization selective DOE surface for the beamsplitter/servo-generating function. Due to its polarization-selective nature, there is no diffraction by this surface as light propagates towards the disk. Thus the diffraction efficiency can be maintained at near 100% for both the light being focused onto the disk and the return light steered onto the photodetectors. Furthermore, since the invention implements the lens and the beamsplitter/servo-generating optical functions using independent DOE surfaces, there will be no crosstalk between these functions, and therefore no spurious diffraction orders to waste light and create stray-light noise problems.

5. The invention has at least an advantage of using multiple DOE surfaces to compensate chromatic aberration effects. Diffractive surfaces are known to be very dispersive. Diffraction is a strong function of wavelength. In the operation of a pickup head, wavelength shifts of the laser due to aging and changing temperature are unavoidable. This may degrade the performance of the diffractive elements. By using multiple DOE surfaces to implement the diffractive lens as in the invention, positive and negative focusing powers can be balanced between the multiple surfaces so as to provide the desired degree of achromaticity. This is impossible if only a single diffractive surface is used as disclosed in the prior art design.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a stacked optical pickup head, the method comprising:

providing a substrate, which comprises a plurality of photo-detecting systems arranged in a cell array, and each of the photo-detecting systems comprises a light source and a multi-element photodetector formed thereon, wherein the light source and the multi-element photodetector are used in the stacked optical pickup head to allow accessing data stored in an optical data storage medium at a desired position;

performing a fabrication process to form a preliminary diffractive optical element (DOE) stack, which comprise a plurality of functional layers used for performing a desired function of a DOE stack, wherein the preliminary DOE stack comprises a plurality of DOE cells arranged in a regular array associating in space with the cell array of the photo-detecting systems;

slicing the array of the DOE cells into a plurality of individual strips of DOE cells;

precisely locating the individual strips of DOE cells on the substrate so that the DOE cells are aligned to the cells of the cell array of the photo-detecting systems;

dicing the substrate and the preliminary DOE stack into a plurality of individual stacked pickup heads with respect to the DOE cells.

2. The method of claim 1, wherein the functional layers of the preliminary DOE stack are fabricated by steps comprising:

forming at least one lower diffractive lens layer, which contacts with the substrate and provides at least one diffractive DOE surface;

forming a beamsplitter/servo-generating DOE layer on the at least one lower diffractive lens layer, which optionally may or may not be a polarization-selective DOE layer;

forming a quarter-wave retarder layer if the previous beamsplitter/servo-generating DOE layer is a polarization-selective DOE layer to rotate a polarization direction of passing light, wherein the polarization-selective DOE layer and the quarter-wave retarder layer are used together to diffract a portion of a light beam reflected from the storage medium onto the multi-element photodetector; and forming at least one upper diffractive lens layer on the quarter-wave retarder layer, used to provide at least one diffractive DOE surface, wherein the diffractive DOE surfaces of the lower and the upper diffractive lens layers are together used to expand light convergence and to achieve a desired focusing power.

3. The method of claim 2, wherein patterns of the DOE cells of the functional layers of the preliminary DOE stack are formed by processes comprising photolithography and etching.

4. The method of claim 1, wherein the substrate comprises a semiconductor substrate.

5. The method of claim 1, wherein the light source on the substrate comprises a laser source.

6. The method of claim 5, wherein the light source comprises an edge emitting laser diode associating with a turning mirror/beamshaper formed thereon also for turning a light direction from the laser diode to the DOE stack.

7. The method of claim 5, wherein the light source comprises a vertical cavity surface emitting laser (VCSEL).

* * * * *